(12) United States Patent
Lee et al.

(10) Patent No.: US 9,747,963 B2
(45) Date of Patent: Aug. 29, 2017

(54) MULTI-CHANNEL MEMORY SYSTEM USING ASYMMETRIC CHANNEL FREQUENCY SCALING AND RELATED POWER MANAGEMENT METHOD

(71) Applicant: MEDIATEK INC., Hsin-Chu (TW)

(72) Inventors: Ming-Hsien Lee, Hsinchu (TW); Yun-Ching Li, Taoyuan County (TW); Yi-Chih Huang, Hsinchu (TW); Chun-Fang Peng, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 276 days.

(21) Appl. No.: 14/530,837

(22) Filed: Nov. 3, 2014

(65) Prior Publication Data
US 2016/0125923 A1    May 5, 2016

(51) Int. Cl.
| | |
|---|---|
| G06F 3/00 | (2006.01) |
| G11C 8/18 | (2006.01) |
| G11C 5/14 | (2006.01) |
| G11C 8/06 | (2006.01) |
| G11C 8/08 | (2006.01) |
| G06F 13/16 | (2006.01) |
| G11C 7/10 | (2006.01) |
| G06F 12/06 | (2006.01) |

(52) U.S. Cl.
CPC ............ *G11C 8/18* (2013.01); *G06F 13/1684* (2013.01); *G06F 13/1689* (2013.01); *G11C 5/14* (2013.01); *G11C 8/06* (2013.01); *G11C 8/08* (2013.01); *G06F 12/0607* (2013.01); *G11C 7/1072* (2013.01); *Y02B 60/1225* (2013.01); *Y02B 60/1228* (2013.01)

(58) Field of Classification Search
CPC .. G11C 7/1072; G11C 8/18; G11C 8/06–8/08; G11C 5/14; G06F 1/3203
USPC ....................................... 711/105; 710/72–74
See application file for complete search history.

(56) References Cited

U.S. PATENT DOCUMENTS

| | | | | |
|---|---|---|---|---|
| 7,929,367 | B2 * | 4/2011 | Yoo ........................ | G11C 7/065 365/189.05 |
| 8,296,526 | B2 * | 10/2012 | O'Brien .............. | G06F 13/1652 711/147 |
| 9,411,674 | B2 * | 8/2016 | Pattabiraman ........ | G06F 1/3203 |
| 2008/0195806 | A1 * | 8/2008 | Cope ................... | G06F 13/1684 711/111 |
| 2013/0304981 | A1 * | 11/2013 | Paz ...................... | G11C 7/1072 711/105 |
| 2014/0334243 | A1 * | 11/2014 | Duffner .................... | G11C 7/00 365/233.13 |

* cited by examiner

*Primary Examiner* — Tammara Peyton
(74) *Attorney, Agent, or Firm* — Winston Hsu

(57) ABSTRACT

A multi-channel memory system has a memory device, a plurality of channels, and a control circuit. The memory device has a plurality of memory storage spaces. The channels are coupled to the memory storage spaces, respectively, wherein each of the channels is configured to act as a memory interface for accessing a corresponding memory storage space independently. The control circuit controls clock frequencies of clocks on the channels, respectively. At a same time point, the channels include at least a first channel operating at a first clock frequency set by the control circuit and a second channel operating at a second clock frequency set by the control circuit at a same time point, and the second clock frequency is different from the first clock frequency.

20 Claims, 4 Drawing Sheets

MULTI-CHANNEL MEMORY SYSTEM USING ASYMMETRIC CHANNEL FREQUENCY SCALING AND RELATED POWER MANAGEMENT METHOD

BACKGROUND

The disclosed embodiments of the present invention relate to managing power consumption of a memory system, and more particularly, to a multi-channel memory system using asymmetric channel frequency scaling and related power management method.

With the advance of the semiconductor technology, more circuits can be integrated into a single chip. Hence, a system on chip (SoC) has many internal circuit blocks that need to access the same external memory, and therefore requires a higher memory bandwidth. A multi-channel memory may be used to meet the memory bandwidth requirement. Further, power consumption is a primary concern in certain electronic devices such as mobile devices. Since the mobile device is powered by a battery device with limited capacity, the mobile device requires low power for normal operations. However, one typical memory controller design controls all channels of the multi-channel memory to operate at the same clock frequency, regardless of the memory loading. As a result, all channels of the multi-channel memory that operate at the same clock frequency will waste power. In a worst case, the memory system power consumption may be a significant portion of the total power consumption of the mobile device under normal operations.

Thus, there is a need for an innovative channel frequency scaling design for a multi-channel memory that can reduce the memory system power consumption while meeting the required memory bandwidth requirement.

SUMMARY

In accordance with exemplary embodiments of the present invention, a multi-channel memory system using asymmetric channel frequency scaling and related power management method are proposed to solve the above-mentioned problem.

According to a first aspect of the present invention, an exemplary multi-channel memory system is disclosed. The exemplary multi-channel memory system includes a memory device, a plurality of channels, and a control circuit. The memory device includes a plurality of memory storage spaces. The channels are coupled to the memory storage spaces, respectively, wherein each of the channels is configured to act as a memory interface for accessing a corresponding memory storage space independently. The control circuit is configured to control clock frequencies of clocks on the channels, respectively. At a same time point, the channels include at least a first channel operating at a first clock frequency set by the control circuit and a second channel operating at a second clock frequency set by the control circuit at a same time point, and the second clock frequency is different from the first clock frequency.

According to a second aspect of the present invention, an exemplary power management method for a multi-channel memory system is disclosed. The multi-channel memory system has a plurality of channels and a memory device, wherein the channels are coupled to a plurality of memory storage spaces in the memory device, respectively, and each of the channels is configured to act as a memory interface for accessing a corresponding memory storage space independently. The power management method includes: at a same time point, controlling a first channel of the channels to operate at a first clock frequency, controlling a second channel of the channels to operate at a second clock frequency different from the first clock frequency.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

One concept of the present invention is to use an asymmetric channel frequency scaling (ACFS) scheme to perform dynamic frequency scaling upon each memory channel independently. The proposed ACFS scheme enables a multi-channel memory to support high memory bandwidth and low power consumption for normal operations. Further, since multiple memory channels are not required to simultaneously operate at the same clock frequency according to the proposed ACFS scheme, there is no clock relationship limitation between multiple memory channels, which leads to more flexibility in design. Further details of the proposed ACFS scheme are described as below.

Figure 1:
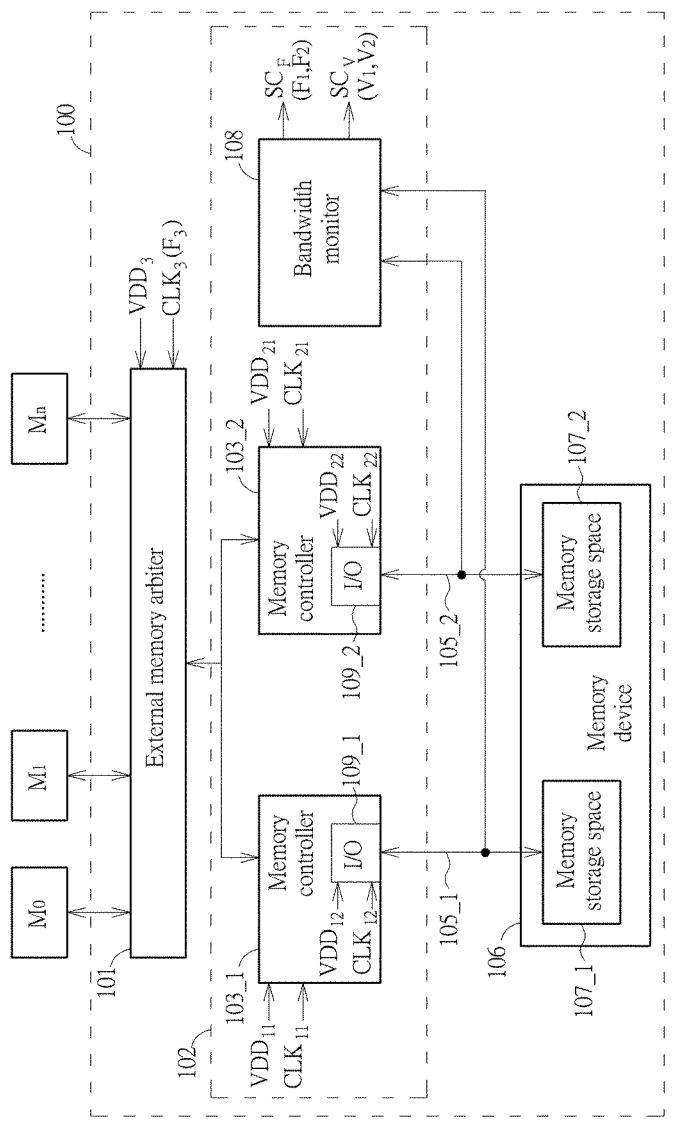
FIG. 1 is a block diagram illustrating a multi-channel memory system according to an embodiment of the present invention.

FIG. 1 is a block diagram illustrating a multi-channel memory system according to an embodiment of the present invention. By way of example, but not limitation, the multi-channel memory system 100 may be part of an electronic device such as a mobile device. The multi-channel memory system 100 is used to service memory access requests, including read requests and write requests, issued from a plurality of master devices $M_0, M_1, \ldots, M_n$ in the electronic device (e.g., a mobile phone, a tablet, or a wearable device). In this embodiment, the multi-channel memory system 100 includes an external memory arbiter 101, a control circuit 102 having a plurality of memory controllers (e.g., two memory controllers 103_1 and 103_2) and an optional bandwidth monitor 108 included therein, a plurality of channels (e.g., two channels 105_1 and 105_2), and a memory device 106 with a plurality of memory storage spaces (e.g., two memory storage spaces 107_1 and 107_2). It should be noted that only the circuit components pertinent to the present invention are shown in FIG. 1. In practice, the multi-channel memory system 100 is allowed to include additional circuit components based on the actual design consideration. Further, the number of memory controllers, the number of channels, and the number of memory storage spaces are equal to the same value, and may be adjusted based on the actual design consideration. For clarity and simplicity, the following uses a two-channel memory system to explain technical features of the present invention. A person skilled in the art should readily understand that the proposed asymmetric channel frequency scaling can also be applied to an N-channel memory system, where N>2.

Since the same memory device 106 is shared among master devices $M_0$-$M_n$, it is possible that multiple master devices, say $M_0$ and $M_1$, issue memory access requests at the same time. Hence, the external memory arbiter 101 is configured to arbitrate the memory access requests issued from multiple master devices. In this example, the external memory arbiter 101 operates according to a supply voltage $VDD_3$ and a clock $CLK_3$, and may output one of the memory access requests that has a higher priority to memory controllers 103_1 and 103_2 in the control circuit 102.

As shown in FIG. 1, the channel 105_1 is coupled between the memory controller 103_1 and the memory storage space 107_1, and the channel 105_2 is coupled between the memory controller 103_2 and the memory storage space 107_2. It should be noted that each of the channels 105_1 and 105_2 is configured to act as a memory interface for accessing a corresponding memory storage space independently. For example, the memory device 106 is a low power double data rate (LPDDR) memory device, and each channel is a complete LPDDR memory interface, including command pins, address pins, data pins, etc. In addition, each memory storage space that can be independently accessed may include one or more memory ranks.

In one exemplary design, one of the functions of the control circuit 102 is to control clock frequencies of clocks $CLK_{12}$ and $CLK_{22}$ on the channels 105_1 and 105_2, respectively. When the proposed ACFS scheme is performed, the channel 105_1 may be controlled to operate at a first clock frequency $F_1$ determined by the control circuit 102, and the channel 105_2 may be controlled to operate at a second clock frequency $F_2$ determined by the control circuit 102, where the second clock frequency is different from the first clock frequency (i.e., $F_1 \neq F_2$). In other words, at the same time point, the channels 105_1 and 105_2 may operate at different clock frequencies. For example, when all of the channels 105_1 and 105_2 are simultaneously used to access the memory device 106 in response to the same memory access request, the first clock frequency $F_1$ and the second clock frequency $F_2$ may be set by different non-zero frequency values for lower power consumption.

The supply voltage of a circuit component may be adjusted to minimize power consumption while still achieving the desired functionality and performance. For example, a lower operating frequency may allow for a lower supply voltage. In addition to channel-independent frequency scaling (i.e., proposed ACFS scheme), asymmetric voltage scaling may be employed to further reduce the power consumption. Therefore, in addition to controlling the channels 105_1 and 105_2 to operate at different clock frequencies, the control circuit 102 is further configured to control the driving of the channel 105_1 (e.g., a driver of the channel 105_1) according to a first supply voltage $V_1$ and control the driving of the channel 105_2 (e.g., a driver of the channel 105_2) according to a second supply voltage $V_2$ at the same time point, where the second supply voltage is different from the first supply voltage (i.e., $V_2 \neq V_1$). It should be noted that, in one exemplary implementation of the present invention, the interface voltages of the channels 105_1 and 105_2 are required to remain unchanged during the asymmetric channel frequency scaling.

As shown in FIG. 1, the memory controller 103_1 includes input/output circuitry (denoted by "I/O" in FIG. 1) 109_1 used to control signal transmission over the corresponding channel 105_1, and the memory controller 103_2 includes input/output circuitry (denoted by "I/O" in FIG. 1) 109_2 used to control signal transmission over the corresponding channel 105_2. For example, the input/output circuitry 109_1 may include the driver of the channel 105_1, and the input/output circuitry 109_2 may include the driver of the channel 105_2. In other words, the behavior of the input/output circuitry 109_1 defines the characteristics of the channel 105_1, and the behavior of the input/output circuitry 109_2 defines the characteristics of the channel 105_2. The input/output circuitry 109_1 operates according to a supply voltage $VDD_{12}$ and a clock $CLK_{12}$. The input/output circuitry 109_2 operates according to a supply voltage $VDD_{22}$ and a clock $CLK_{22}$. As mentioned above, each of the channels 105_1 and 105_2 is a complete memory interface, including command pins, address pins, data pins, etc. Hence, the input/output circuitry 109_1 may output the clock $CLK_{12}$ to the memory storage space 107_1, and transmit commands, addresses and data to the memory storage space 107_1 based on timing of the clock $CLK_{12}$. Similarly, the input/output circuitry 109_2 may output the clock $CLK_{22}$ to the memory storage space 107_2, and transmit commands, addresses and data to the memory storage space 107_2 based on timing of the clock $CLK_{22}$.

When the channel-independent frequency scaling (i.e., proposed ACFS scheme) is performed at a time point, the clock frequency of the clock $CLK_{12}$ may be set by the aforementioned first clock frequency $F_1$, and the clock frequency of the clock $CLK_{22}$ may be set by the aforementioned second clock frequency $F_2$. In addition, when the voltage scaling is also performed at the same time point, the supply voltage $VDD_{12}$ may be set by the aforementioned first supply voltage $V_1$, and the supply voltage $VDD_{22}$ may be set by the aforementioned second supply voltage $V_2$. In this way, the input/output circuitry 109_1 and the input/output circuitry 109_2 are allowed to have different operating conditions, including different clock frequencies and/or different supply voltages. Hence, when channels 105_1 and 105_2 are both active for command, address, data and clock transmission, the channels 105_1 and 105_2 can operate under different clock frequencies, and can be driven by respective drivers operating under different supply voltages.

Besides the input/output circuitry 109_1, the memory controller 103_1 includes other circuitry (not shown) operating according to a supply voltage $VDD_{11}$ and a clock $CLK_{11}$. Based on actual design consideration, supply voltage $VDD_{12}$ may be identical to or different from supply voltage $VDD_{11}$, and clock $CLK_{12}$ may be identical to or different from clock $CLK_{11}$. For example, the clock $CLK_{11}$ may be an operating clock (e.g., a system clock) fed into the memory controller 103_1, and the clock $CLK_{12}$ may be derived from the clock $CLK_{11}$. Besides the input/output circuitry 109_2, the memory controller 103_2 includes other circuitry (not shown) operating according to a supply voltage $VDD_{21}$ and a clock $CLK_{21}$. Similarly, based on actual design consideration, supply voltage $VDD_{22}$ may be identical to or different from supply voltage $VDD_{21}$, and clock $CLK_{22}$ may be identical to or different from clock $CLK_{21}$. For example, the clock $CLK_{21}$ may be an operating clock (e.g., a system clock) fed into the memory controller 103_2, and the clock $CLK_{22}$ may be derived from the clock $CLK_{21}$.

In a preferred embodiment, asymmetric frequency scaling and/or asymmetric voltage scaling may be applied to other circuitry in each of the memory controllers 103_1 and 103_2 for low power consumption. Hence, other circuitry in the memory controllers 103_1 and 103_2 may operate under different operating conditions, including different clock frequencies and/or different supply voltages, at the time the channels 105_1 and 105_2 are currently operating under different operating conditions.

Consider a case where asymmetric frequency scaling and asymmetric voltage scaling are both applied to other circuitry in the memory controllers 103_1 and 103_2. In one exemplary design, the clocks $CLK_{11}$ and $CLK_{12}$ may be controlled to have the same clock frequency, the supply voltages $VDD_{11}$ and $VDD_{12}$ may be controlled to have the same voltage level, the clocks $CLK_{21}$ and $CLK_{22}$ may be controlled to have the same clock frequency, and the supply voltages $VDD_{21}$ and $VDD_{22}$ may be controlled to have the same voltage level. Hence, when the channel-independent frequency scaling is performed, the clock frequency of each of the clocks $CLK_{11}$ and $CLK_{12}$ may be set by the aforementioned first clock frequency $F_1$, and the clock frequency of each of the clocks $CLK_{21}$ and $CLK_{22}$ may be set by the aforementioned second clock frequency $F_2$. In addition, when the voltage scaling is performed, each of the supply voltages $VDD_{11}$ and $VDD_{12}$ may be set by the aforementioned first supply voltage $V_1$, and each of the supply voltages $VDD_{21}$ and $VDD_{22}$ may be set by the aforementioned second supply voltage $V_2$. It should be noted that, the above frequency setting and voltage setting are for illustrative purposes only, and are not meant to be a limitation of the present invention.

In this case, the memory controllers 103_1 and 103_2 may communicate with the external memory arbiter 101 through an asynchronous interface. For example, the external memory arbiter 101 may operate according to the clock $CLK_3$ with a fixed clock frequency (e.g., a third clock frequency $F_3$). Since frequency scaling is applied to the clocks $CLK_{11}$ and $CLK_{21}$ respectively used by the memory controllers 103_1 and 103_2, one or both of the clocks $CLK_{11}$ and $CLK_{21}$ may be asynchronous to the clock $CLK_3$. That is, when the channel-independent frequency scaling is performed, one or both of the first clock frequency $F_1$ set to the clock $CLK_{11}$ and the second clock frequency $F_2$ set to the clock $CLK_{21}$ are different from the third clock frequency $F_3$.

Consider another case where none of asymmetric frequency scaling and asymmetric voltage scaling is applied to other circuitry in the memory controllers 103_1 and 103_2. In this case, the memory controllers 103_1 and 103_2 may communicate with the external memory arbiter 101 through a synchronous interface. For example, the external memory arbiter 101 may operate according to the supply voltage $VDD_3$ with a fixed voltage level and the clock $CLK_3$ with a fixed clock frequency (e.g., $F_3$). The clocks $CLK_{11}$ and $CLK_{21}$ may be controlled to have the same clock frequency possessed by the clock $CLK_3$, and the supply voltages $VDD_{11}$ and $VDD_{21}$ may be controlled to have the same voltage level possessed by the supply voltage $VDD_3$. When the channel-independent frequency scaling is performed, the clock frequency of the clock $CLK_{12}$ may be adjusted to the first clock frequency $F_1$ that is different from the clock frequency (e.g., $F_3$) of the clock $CLK_{11}$, and the clock frequency of the clock $CLK_{22}$ may be adjusted to the second clock frequency $F_2$ that is different from the clock frequency (e.g., $F_3$) of the clock $CLK_{21}$. When the voltage scaling is performed, the supply voltage $VDD_{12}$ may be adjusted to the first supply voltage $V_1$ that is different from the supply voltage $VDD_{11}$ (e.g., $VDD_{11}=VDD_3$), and the supply voltage $VDD_{22}$ may be adjusted to the second supply voltage $V_2$ that is different from the supply voltage $VDD_{21}$ (e.g., $VDD_{21}=VDD_3$).

To put it simply, no matter whether asymmetric frequency scaling and/or asymmetric voltage scaling are applied to other circuitry in the memory controllers 103_1 and 103_2, any multi-channel memory system applying asymmetric frequency scaling to multiple memory channels falls within the scope of the present invention. Further, although voltage scaling may be employed to further reduce the power consumption, it is not meant to be a limitation of the present invention. In an alternative design, voltage scaling applied to the memory controllers 103_1 and 103_2 may be omitted. This also falls within the scope of the present invention.

In this embodiment, the control circuit 102 may employ a bandwidth-aware ACFS scheme to configure clock frequencies of clocks on channels 109_1 and 109_2. Hence, the bandwidth monitor 108 is a hardware component designed for monitoring a required channel bandwidth of each channel to dynamically adjust a clock frequency of a clock on the channel. For example, clocks $CLK_{12}$ and $CLK_{22}$ are generated from clock generators (which may be located inside or outside the memory controllers 103_1 and 103_2). Based on the required channel bandwidth of each channel, the bandwidth monitor 108 generates a frequency control output $SC_F$ to the clock generators. Hence, the clock frequency of the clock associated with the monitored channel is adjusted in response to a frequency setting included in the frequency control output $SC_F$. Further, when the required channel bandwidth of the monitored channel changes, the clock frequency of the clock associated with the monitored channel is updated correspondingly. For example, the higher is the required channel bandwidth, the clock frequency is set by a higher frequency value.

Further, in a case where supply voltages $VDD_{12}$ and $VDD_{22}$ are required to be adaptively adjusted along with clock frequency scaling of clocks $CLK_{12}$ and $CLK_{22}$, the control circuit 102 may employ a bandwidth-aware voltage scaling scheme. In this embodiment, the bandwidth monitor 108 is further configured for monitoring the required channel bandwidth of each channel to dynamically adjust a supply voltage used by the control circuit 102 for controlling the driving of the channel. For example, supply voltages $VDD_{12}$ and $VDD_{22}$ are generated from voltage generators (which may be implemented in a power management integrated circuit (PMIC)). Based on the required channel bandwidth of each channel, the bandwidth monitor 108 further generates a voltage control output $SC_V$ to the voltage generators. Hence, the supply voltage used to control the driving of the monitored channel is adjusted in response to a voltage setting included in the voltage control output $SC_V$. When the required channel bandwidth of the monitored channel changes, the supply voltage used to control the driving of the monitored channel is updated correspondingly. For example, the higher is the required channel bandwidth, the supply voltage is set by a higher voltage value.

As mentioned above, the bandwidth monitor 108 is a hardware-based means capable of controlling frequency scaling for each channel. However, this is for illustrative purposes only, and is not meant to be a limitation of the present invention. Alternatively, the bandwidth monitor 108 may be omitted, and a software-based means may be used to estimate a required channel bandwidth of each channel and refer to the required channel bandwidth to control frequency scaling for the channel. For example, a bandwidth monitor program may be loaded and executed by a processor, and used to estimate a required channel bandwidth of each channel according to bandwidth usage characteristics of applications currently running on the electronic device.

The memory addressing of the memory device 106 may be configured using an interleaving mode for higher memory efficiency and/or a cascade mode for lower power consumption. If memory addresses are allocated/mapped to the memory storage spaces 107_1 and 107_2 in the interleaving mode for higher memory efficiency under normal operations, the standby power consumption of the memory device 106 will be too high. If memory addresses are allocated/mapped to the memory storage spaces 107_1 and 107_2 in the cascade mode for lower standby power consumption, the power consumption of the memory device 106 will be higher under normal operations. In a preferred embodiment, the memory addressing of the memory device 106 may be configured using a hybrid mode, including an interleaving mode for higher memory efficiency and a cascade mode for lower power consumption. Hence, when memory addresses are allocated/mapped to the memory storage spaces 107_1 and 107_2 in the hybrid mode, the multi-channel memory system 100 can support higher memory efficiency as well as lower power consumption.

Figure 2:
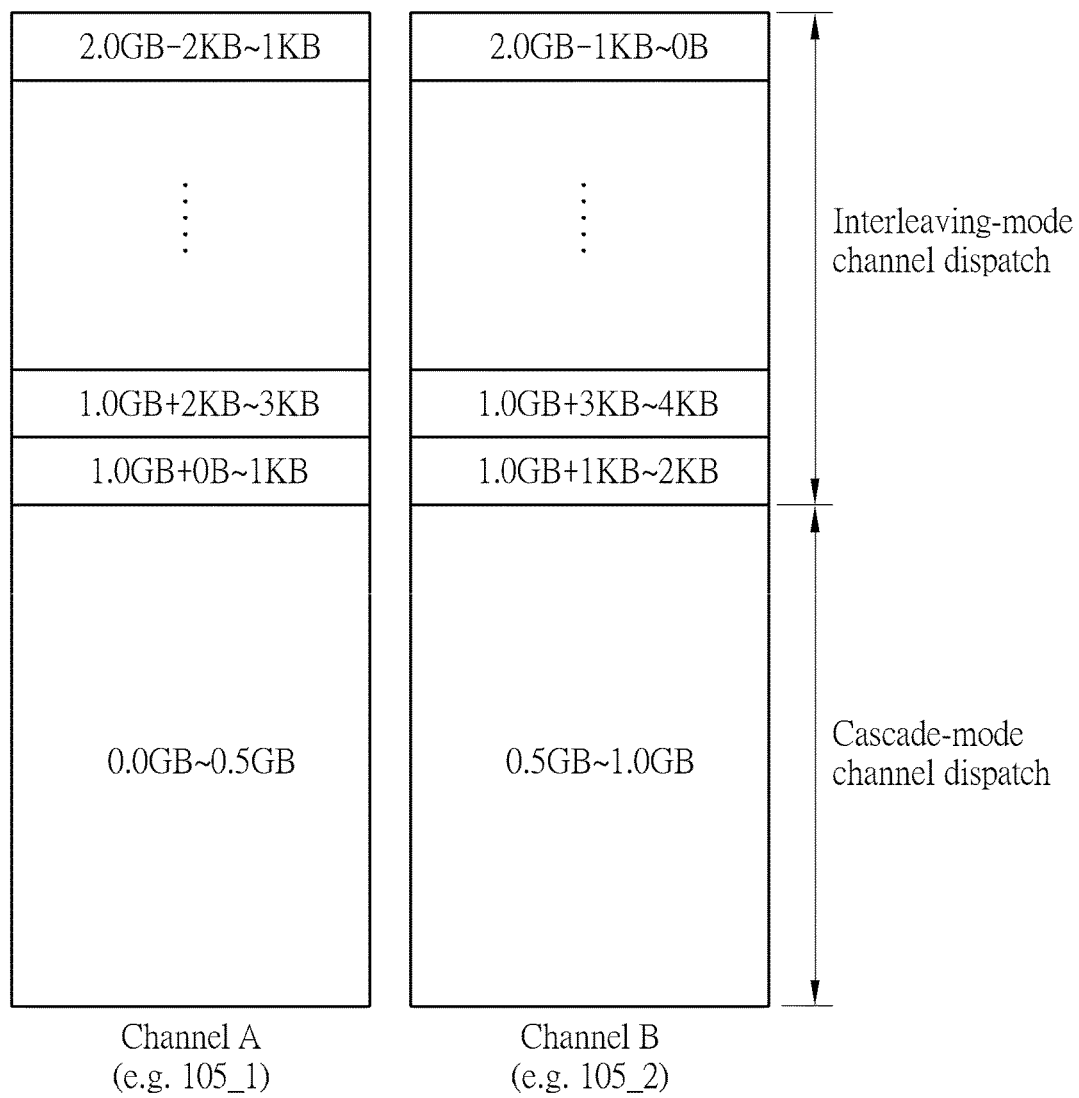
FIG. 2 is a diagram illustrating an example of a hybrid-mode memory addressing design used by the multi-channel memory system shown in FIG. 1.

FIG. 2 is a diagram illustrating an example of a hybrid-mode memory addressing design used by the multi-channel memory system 100 shown in FIG. 1. Any memory access requests issued for accessing (reading or writing) memory addresses within a cascade-mode address range [0.0 GB (Gigabytes), 0.5 GB] are serviced by the memory storage space 107_1 via channel A (e.g., channel 105_1). Any memory access requests issued for accessing (reading or writing) memory addresses within another cascade-mode address range [0.5 GB, 1.0 GB] are serviced by the memory storage space 107_2 via channel B (e.g., channel 105_1). Any memory access requests issued for accessing (reading or writing) memory addresses within an interleaving-mode address range [1.0 GB+0 B (Byte), 1.0 GB+1 KB] are serviced by the memory storage space 107_1 via channel A (e.g., channel 105_1). Any memory access requests issued for accessing (reading or writing) memory addresses within another interleaving-mode address range [1.0 GB+1 KB, 1.0 GB+2 KB] are serviced by the memory storage space 107_2 via channel B (e.g., channel 105_2). Since the rest can be deduced by analogy, further description is omitted here for brevity.

Figure 3:
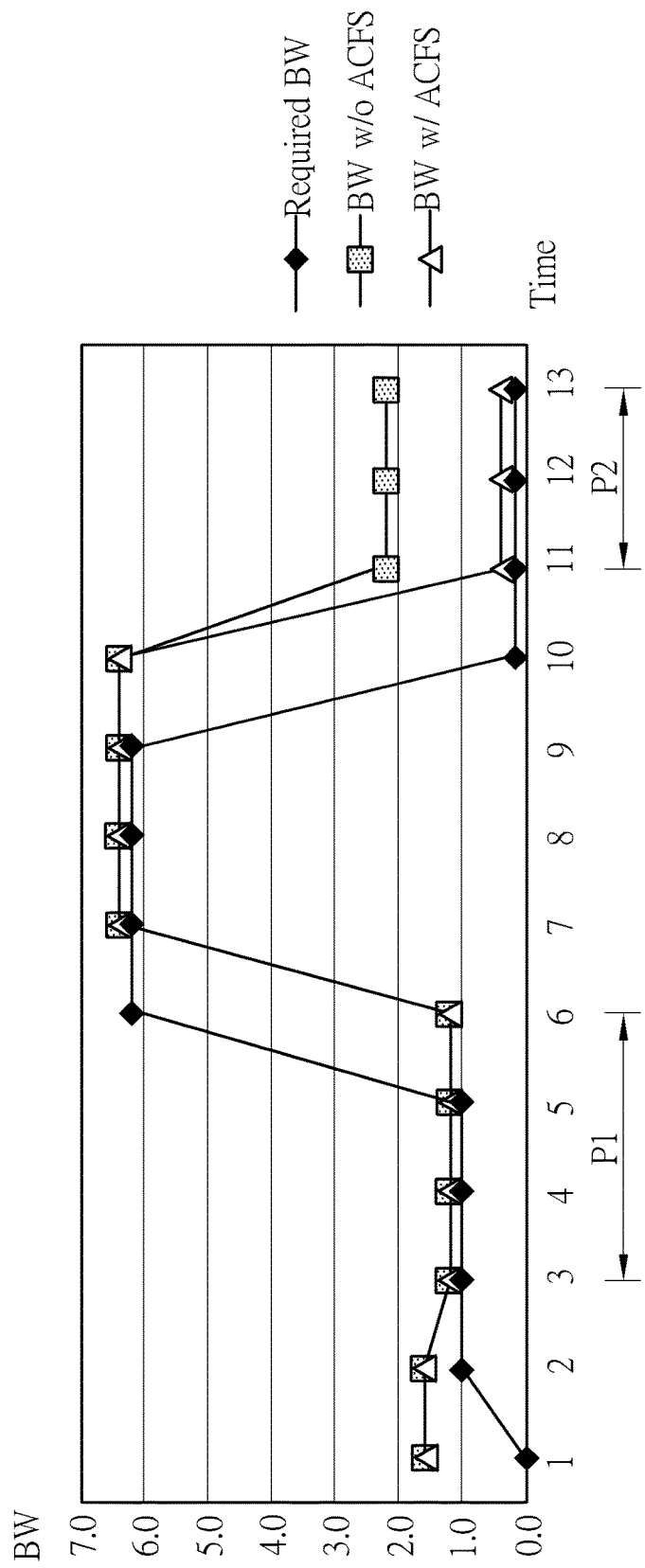
FIG. 3 is a diagram illustrating one channel's bandwidth adjusted due to frequency scaling.
Figure 4:
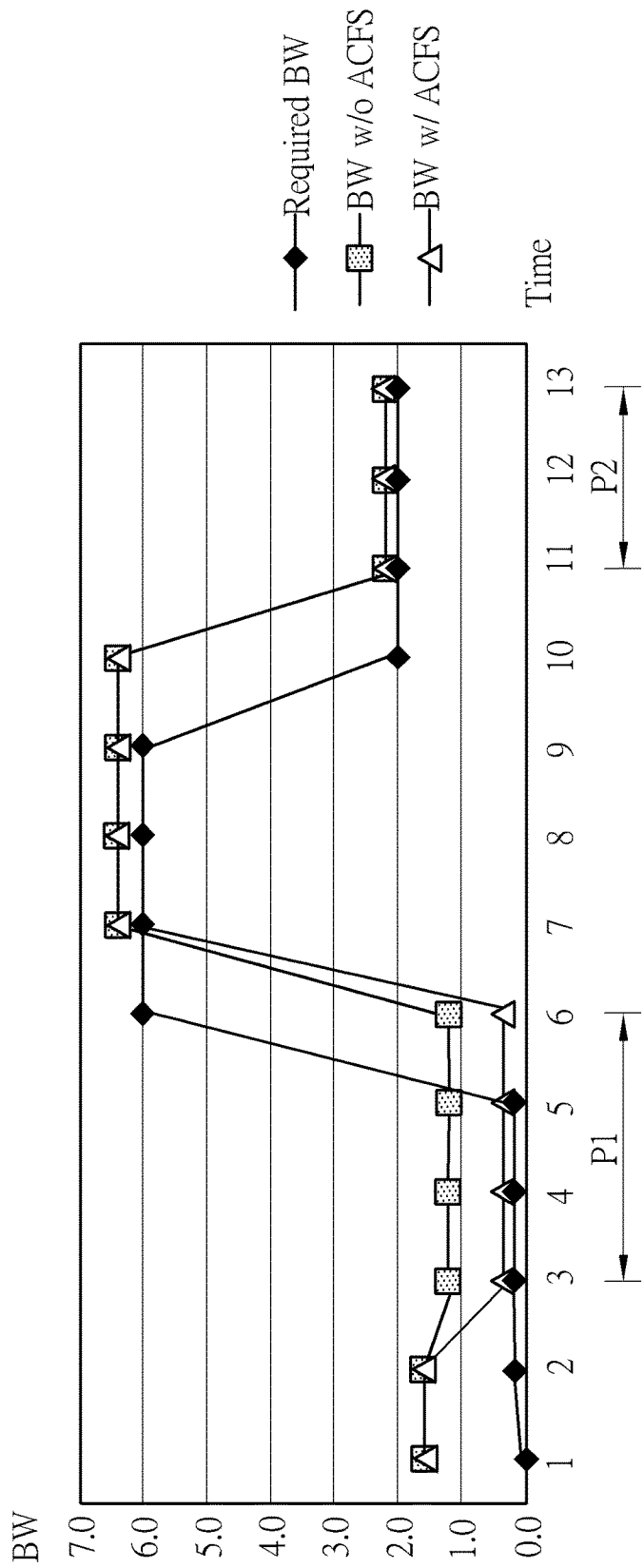
FIG. 4 is a diagram illustrating another channel's bandwidth adjusted due to frequency scaling.

The proposed ACFS scheme allows independent frequency scaling for each memory channel of a multi-channel memory. Since there is no clock relationship limitation between different channels, the clock frequency of each channel can be properly adjusted to reduce the power consumption of the channel while meeting the bandwidth requirement of the channel. A comparison between a proposed ACFS scheme of the present invention and a conventional frequency scaling scheme (e.g., a symmetric channel frequency scaling scheme) for a multi-channel memory is illustrated in FIG. 3 and FIG. 4. FIG. 3 is a diagram illustrating the bandwidth (BW) of channel A (e.g., channel 105_1) that is adjusted due to frequency scaling. FIG. 4 is a diagram illustrating the bandwidth of channel B (e.g., channel 105_2) that is adjusted due to frequency scaling. In each of FIG. 3 and FIG. 4, a curve indicative of the required bandwidth, a curve indicative of the bandwidth with ACFS, and a curve indicative of the bandwidth without ACFS are illustrated. As can be seen from FIG. 3 and FIG. 4, the curve indicative of the bandwidth without ACFS in channel A is the same as the curve indicative of the bandwidth without ACFS in channel B, the curve indicative of the required bandwidth in channel A is different from the curve indicative of the required bandwidth in channel B, and the curve indicative of the bandwidth with ACFS in channel A is different from the curve indicative of the bandwidth with ACFS in channel B.

During a time period P1, the required bandwidth in channel A is higher than the required bandwidth in channel B. The conventional frequency scaling scheme controls the clock frequency of channel A to make the bandwidth (i.e., bandwidth without ACFS) of channel A approach the required bandwidth in channel A. However, since the conventional frequency scaling scheme makes the clock frequency of channel B identical to the clock frequency of channel A, the bandwidth (i.e., bandwidth without ACFS) of channel B is higher than the required bandwidth in channel B, which results in waste of the power. In contrast to the conventional frequency scaling scheme, the proposed ACFS scheme controls the clock frequency of channel A to make the bandwidth (i.e., bandwidth with ACFS) of channel A approach the required bandwidth in channel A, and further controls the clock frequency of channel B to make the bandwidth (i.e., bandwidth with ACFS) of channel B approach the required bandwidth in channel B. Hence, the proposed ACFS scheme can reduce the power consumption while achieving the desired memory efficiency.

During a time period P2, the required bandwidth in channel B is higher than the required bandwidth in channel A. The conventional frequency scaling scheme controls the clock frequency of channel B to make the bandwidth (i.e., bandwidth without ACFS) of channel B approach the required bandwidth in channel B. However, since the conventional frequency scaling scheme makes the clock frequency of channel A identical to the clock frequency of channel B, the bandwidth (i.e., bandwidth without ACFS) of channel A is higher than the required bandwidth in channel A, which results in waste of the power. In contrast to the conventional frequency scaling scheme, the proposed ACFS scheme controls the clock frequency of channel A to make the bandwidth (i.e., bandwidth with ACFS) of channel A approach the required bandwidth in channel A, and further controls the clock frequency of channel B to make the bandwidth (i.e., bandwidth with ACFS) of channel B approach the required bandwidth in channel B. Hence, the proposed ACFS scheme can reduce the power consumption while achieving the desired memory efficiency.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A multi-channel memory system, comprising:
a memory device, comprising a plurality of memory storage spaces;
a plurality of channels, coupled to the memory storage spaces, respectively, wherein each of the channels is configured to act as a memory interface for accessing a corresponding memory storage space independently; and
a control circuit, configured to control clock frequencies of clocks on the channels, wherein at a same time point, the channels include at least a first channel operating at a first clock frequency set by the control circuit and a second channel operating at a second clock frequency set by the control circuit, and the second clock frequency is different from the first clock frequency, wherein a transmission on the first channel is performed according to the first clock frequency and a transmission on the second channel is performed according to the second clock frequency.

2. The multi-channel memory system of claim 1, wherein each of the first clock frequency and the second clock frequency has a non-zero frequency value.

3. The multi-channel memory system of claim 1, wherein the memory storage spaces comprise a first memory storage space coupled to the first channel and a second memory storage space coupled to the second channel; and the control circuit is further configured to allocate memory addresses to the first memory storage space and the second memory storage space in a hybrid mode including an interleaving mode and a cascade mode.

4. The multi-channel memory system of claim 1, wherein the control circuit comprises:
a first memory controller, configured to control the first channel; and
a second memory controller, configured to control the second channel, wherein at the same time point, an operating clock fed into the first memory controller and an operating clock fed into the second memory controller have different clock frequencies.

5. The multi-channel memory system of claim 1, wherein at the same time point, the control circuit is further configured to control driving of the first channel according to a first supply voltage, and control driving of the second channel according to a second supply voltage different from the first supply voltage.

6. The multi-channel memory system of claim 5, wherein the control circuit comprises:
a first memory controller, configured to control the first channel; and
a second memory controller, configured to control the second channel, wherein at the same time point, a supply voltage of the first memory controller is set by the first supply voltage, and a supply voltage of the second memory controller is set by the second supply voltage.

7. The multi-channel memory system of claim 5, wherein the control circuit comprises:
a bandwidth monitor, configured to monitor a required channel bandwidth of each channel to dynamically adjust a supply voltage used by the control circuit for controlling driving of the channel.

8. The multi-channel memory system of claim 1, wherein the control circuit comprises:
a bandwidth monitor, configured to monitor a required channel bandwidth of each channel to dynamically adjust a clock frequency of a clock on the channel.

9. The multi-channel memory system of claim 1, wherein the control circuit is configured to apply dynamic frequency scaling to the first channel and apply dynamic frequency scaling to the second channel; and the dynamic frequency scaling applied to the first channel is independent of the dynamic frequency scaling applied to the second channel.

10. The multi-channel memory system of claim 1, wherein the memory device is a low power double data rate (LPDDR) memory device.

11. A power management method for a multi-channel memory system having a plurality of channels and a memory device, wherein the channels are coupled to a plurality of memory storage spaces in the memory device, respectively, and each of the channels is configured to act as a memory interface for accessing a corresponding memory storage space independently; the power management method comprising:
at a same time point, controlling a first channel of the channels to operate at a first clock frequency, and controlling a second channel of the channels to operate at a second clock frequency different from the first clock frequency, wherein a transmission on the first channel is performed according to the first clock frequency and a transmission on the second channel is performed according to the second clock frequency.

12. The power management method of claim 11, wherein each of the first clock frequency and the second clock frequency has a non-zero frequency value.

13. The power management method of claim 11, wherein the memory storage spaces comprise a first memory storage space coupled to the first channel and a second memory storage space coupled to the second channel; and memory addresses are allocated to the first memory storage space and the second memory storage space in a hybrid mode including an interleaving mode and a cascade mode.

14. The power management method of claim 11, further comprising:
using a first memory controller to control the first channel;
using a second memory controller to control the second channel;
setting an operating clock fed into the first memory controller; and
setting an operating clock fed into the second memory controller;
wherein at the same time point, the operating clock fed into the first memory controller and the operating clock fed into the second memory controller have different clock frequencies.

15. The power management method of claim 11, further comprising:
at the same time point, controlling driving of the first channel according to a first supply voltage, and controlling driving of the second channel according to a second supply voltage different from the first supply voltage.

16. The power management method of claim 15, wherein the step of controlling the driving of the first channel according to the first supply voltage comprises:
using a first memory controller to control the first channel; and
setting a supply voltage of the first memory controller; and
the step of controlling the driving of the second channel according to the second supply voltage comprises:
using a second memory controller to control the second channel; and
setting a supply voltage of the second memory controller, wherein at the same time point, the supply voltage of the first memory controller is set by the first supply voltage, and the supply voltage of the second memory controller is set by the second supply voltage.

17. The power management method of claim 15, further comprising:
monitoring a required channel bandwidth of each channel to dynamically adjust a supply voltage used for controlling driving of the channel.

18. The power management method of claim 11, further comprising:

monitoring a required channel bandwidth of each channel to dynamically adjust a clock frequency of a clock on the channel.

19. The power management method of claim 11, wherein the step of controlling the first channel comprises applying dynamic frequency scaling to the first channel, the step of controlling the second channel comprises applying dynamic frequency scaling to the second channel, and the dynamic frequency scaling applied to the first channel is independent of the dynamic frequency scaling applied to the second channel.

20. The power management method of claim 11, wherein the memory device is a low power double data rate (LPDDR) memory device.

* * * * *